(12) United States Patent
Yeh et al.

(10) Patent No.: US 8,426,284 B2
(45) Date of Patent: Apr. 23, 2013

(54) MANUFACTURING METHOD FOR SEMICONDUCTOR STRUCTURE

(75) Inventors: Chiu-Hsien Yeh, Tainan (TW); Chin-Cheng Chien, Tainan (TW); Yu-Wen Wang, New Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 120 days.

(21) Appl. No.: 13/104,981

(22) Filed: May 11, 2011

(65) Prior Publication Data

US 2012/0289009 A1    Nov. 15, 2012

(51) Int. Cl.
*H01L 21/336* (2006.01)

(52) U.S. Cl.
USPC ............... 438/300; 438/745; 257/E21.221

(58) Field of Classification Search ................. 438/300, 438/745; 257/E21.221, E21.223
See application file for complete search history.

(56) References Cited

U.S. PATENT DOCUMENTS

| | | | |
|---|---|---|---|
| 4,891,303 A | 1/1990 | Garza et al. | |
| 5,217,910 A | 6/1993 | Shimizu et al. | |
| 5,273,930 A | 12/1993 | Steele et al. | |
| 5,356,830 A | 10/1994 | Yoshikawa et al. | |
| 5,372,957 A | 12/1994 | Liang et al. | |
| 5,385,630 A | 1/1995 | Philipossian et al. | |
| 5,399,506 A | 3/1995 | Tsukamoto | |
| 5,625,217 A | 4/1997 | Chau et al. | |
| 5,777,364 A | 7/1998 | Crabbe et al. | |
| 5,783,478 A | 7/1998 | Chau et al. | |
| 5,783,479 A | 7/1998 | Lin et al. | |
| 5,793,090 A | 8/1998 | Gardner et al. | |
| 5,960,322 A | 9/1999 | Xiang et al. | |
| 6,030,874 A | 2/2000 | Grider et al. | |
| 6,048,756 A | 4/2000 | Lee et al. | |
| 6,074,954 A | 6/2000 | Lill et al. | |
| 6,100,171 A | 8/2000 | Ishida | |
| 6,110,787 A | 8/2000 | Chan et al. | |
| 6,165,826 A | 12/2000 | Chau et al. | |
| 6,165,881 A | 12/2000 | Tao et al. | |
| 6,191,052 B1 | 2/2001 | Wang | |
| 6,228,730 B1 | 5/2001 | Chen et al. | |
| 6,274,447 B1 | 8/2001 | Takasou | |
| 6,355,533 B2 | 3/2002 | Lee | |
| 6,365,476 B1 | 4/2002 | Talwar et al. | |
| 6,368,926 B1 | 4/2002 | Wu | |
| 6,444,591 B1 | 9/2002 | Schuegraf et al. | |
| 6,537,370 B1 | 3/2003 | Hernandez et al. | |
| 6,544,822 B2 | 4/2003 | Kim et al. | |
| 6,605,498 B1 | 8/2003 | Murthy et al. | |
| 6,613,695 B2 | 9/2003 | Pomarede et al. | |
| 6,621,131 B2 | 9/2003 | Murthy et al. | |
| 6,624,068 B2 | 9/2003 | Thakar et al. | |
| 6,632,718 B1 | 10/2003 | Grider et al. | |
| 6,642,122 B1 | 11/2003 | Yu | |
| 6,664,156 B1 | 12/2003 | Ang et al. | |
| 6,676,764 B2 | 1/2004 | Joo | |

(Continued)

*Primary Examiner* — Quoc Hoang
(74) *Attorney, Agent, or Firm* — Winston Hsu; Scott Margo

(57) ABSTRACT

A manufacturing method for a semiconductor structure includes providing a substrate having at least a gate structure formed thereon, performing a first wet etching process to etch the substrate at two sides of the gate structure, performing a second wet etching process to etch the substrate to form a recess respectively at two sides of the gate structure, and performing a selective epitaxial growth method to form an epitaxial layer having a diamond shape with a flat bottom respectively in the recess.

19 Claims, 3 Drawing Sheets

U.S. PATENT DOCUMENTS

| | | |
|---|---|---|
| 6,699,763 B2 | 3/2004 | Grider et al. |
| 6,703,271 B2 | 3/2004 | Yeo et al. |
| 6,777,275 B1 | 8/2004 | Kluth |
| 6,806,151 B2 | 10/2004 | Wasshuber et al. |
| 6,809,402 B1 | 10/2004 | Hopper et al. |
| 6,858,506 B2 | 2/2005 | Chang |
| 6,861,318 B2 | 3/2005 | Murthy et al. |
| 6,864,135 B2 | 3/2005 | Grudowski et al. |
| 6,869,867 B2 | 3/2005 | Miyashita et al. |
| 6,887,751 B2 | 5/2005 | Chidambarrao et al. |
| 6,887,762 B1 | 5/2005 | Murthy et al. |
| 6,891,192 B2 | 5/2005 | Chen et al. |
| 6,930,007 B2 | 8/2005 | Bu et al. |
| 6,946,350 B2 | 9/2005 | Lindert et al. |
| 6,962,856 B2 | 11/2005 | Park et al. |
| 6,972,461 B1 | 12/2005 | Chen et al. |
| 6,991,979 B2 | 1/2006 | Ajmera et al. |
| 6,991,991 B2 | 1/2006 | Cheng et al. |
| 7,037,773 B2 | 5/2006 | Wang et al. |
| 7,060,576 B2 | 6/2006 | Lindert et al. |
| 7,060,579 B2 | 6/2006 | Chidambaram et al. |
| 7,112,495 B2 | 9/2006 | Ko et al. |
| 7,118,952 B2 | 10/2006 | Chen et al. |
| 7,132,338 B2 | 11/2006 | Samoilov et al. |
| 7,169,675 B2 | 1/2007 | Tan et al. |
| 7,183,596 B2 | 2/2007 | Wu et al. |
| 7,202,124 B2 | 4/2007 | Fitzgerald et al. |
| 7,217,627 B2 | 5/2007 | Kim |
| 7,288,822 B1 | 10/2007 | Ting et al. |
| 7,303,999 B1 | 12/2007 | Sriraman et al. |
| 7,335,959 B2 | 2/2008 | Curello et al. |
| 7,410,859 B1 | 8/2008 | Peidous et al. |
| 7,462,239 B2 | 12/2008 | Brabant et al. |
| 7,494,856 B2 | 2/2009 | Zhang et al. |
| 7,494,858 B2 | 2/2009 | Bohr |
| 7,560,758 B2 | 7/2009 | Zhu et al. |
| 7,592,231 B2 | 9/2009 | Cheng et al. |
| 7,667,227 B2 | 2/2010 | Shimamune et al. |
| 7,691,752 B2 | 4/2010 | Ranade et al. |
| 7,838,370 B2 | 11/2010 | Mehta et al. |
| 8,236,659 B2 * | 8/2012 | Tsai et al. .................... 438/300 |
| 2002/0160587 A1 | 10/2002 | Jagannathan et al. |
| 2002/0182423 A1 | 12/2002 | Chu et al. |
| 2003/0181005 A1 | 9/2003 | Hachimine et al. |
| 2003/0203599 A1 | 10/2003 | Kanzawa et al. |
| 2004/0045499 A1 | 3/2004 | Langdo et al. |
| 2004/0067631 A1 | 4/2004 | Bu et al. |
| 2004/0227164 A1 | 11/2004 | Lee et al. |
| 2005/0070076 A1 | 3/2005 | Dion |
| 2005/0079692 A1 | 4/2005 | Samoilov et al. |
| 2005/0082616 A1 | 4/2005 | Chen et al. |
| 2005/0139231 A1 | 6/2005 | Abadie et al. |
| 2005/0260830 A1 | 11/2005 | Kwon et al. |
| 2005/0285193 A1 | 12/2005 | Lee et al. |
| 2005/0287752 A1 | 12/2005 | Nouri et al. |
| 2006/0051922 A1 | 3/2006 | Huang et al. |
| 2006/0057859 A1 | 3/2006 | Chen |
| 2006/0076627 A1 | 4/2006 | Chen et al. |
| 2006/0088968 A1 | 4/2006 | Shin et al. |
| 2006/0115949 A1 | 6/2006 | Zhang et al. |
| 2006/0134872 A1 | 6/2006 | Hattendorf et al. |
| 2006/0163558 A1 | 7/2006 | Lee et al. |
| 2006/0228842 A1 | 10/2006 | Zhang et al. |
| 2006/0231826 A1 | 10/2006 | Kohyama |
| 2006/0258126 A1 | 11/2006 | Shiono et al. |
| 2006/0281288 A1 | 12/2006 | Kawamura et al. |
| 2006/0292779 A1 | 12/2006 | Chen et al. |
| 2006/0292783 A1 | 12/2006 | Lee et al. |
| 2007/0023847 A1 | 2/2007 | Rhee et al. |
| 2007/0034906 A1 | 2/2007 | Wang et al. |
| 2007/0049014 A1 | 3/2007 | Chen et al. |
| 2007/0072353 A1 | 3/2007 | Wu et al. |
| 2007/0082451 A1 | 4/2007 | Samoilov et al. |
| 2007/0128783 A1 | 6/2007 | Ting et al. |
| 2007/0128786 A1 | 6/2007 | Cheng et al. |
| 2007/0166929 A1 | 7/2007 | Matsumoto et al. |
| 2007/0262396 A1 | 11/2007 | Zhu et al. |
| 2008/0014688 A1 | 1/2008 | Thean et al. |
| 2008/0067545 A1 | 3/2008 | Rhee et al. |
| 2008/0076236 A1 | 3/2008 | Chiang et al. |
| 2008/0085577 A1 | 4/2008 | Shih et al. |
| 2008/0116525 A1 | 5/2008 | Liu et al. |
| 2008/0124874 A1 | 5/2008 | Park et al. |
| 2008/0128746 A1 | 6/2008 | Wang |
| 2008/0142886 A1 | 6/2008 | Liao et al. |
| 2008/0220579 A1 | 9/2008 | Pal et al. |
| 2008/0233722 A1 | 9/2008 | Liao et al. |
| 2008/0233746 A1 | 9/2008 | Huang et al. |
| 2009/0039389 A1 | 2/2009 | Tseng et al. |
| 2009/0095992 A1 | 4/2009 | Sanuki et al. |
| 2009/0108291 A1 | 4/2009 | Cheng et al. |
| 2009/0117715 A1 | 5/2009 | Fukuda et al. |
| 2009/0124056 A1 | 5/2009 | Chen et al. |
| 2009/0166625 A1 | 7/2009 | Ting et al. |
| 2009/0186475 A1 | 7/2009 | Ting et al. |
| 2009/0246922 A1 | 10/2009 | Wu et al. |
| 2009/0278170 A1 | 11/2009 | Yang et al. |
| 2010/0001317 A1 | 1/2010 | Chen et al. |
| 2010/0093147 A1 | 4/2010 | Liao et al. |
| 2012/0100681 A1 * | 4/2012 | Fang et al. .................... 438/269 |

* cited by examiner

1

MANUFACTURING METHOD FOR SEMICONDUCTOR STRUCTURE

BACKGROUND OF THE INVENTION

1. Field of the Invention

The invention relates to a manufacturing method for a semiconductor structure, and more particularly, to a manufacturing method for a semiconductor structure applied with strained-silicon technique.

2. Description of the Prior Art

With semiconductor processes entering the era of the deep submicron meter below 65 nanometer (nm), it has been more and more important to increase the metal-oxide semiconductor (MOS) drive current. To improve device performance, strained-silicon technique such as selective epitaxial growth (SEG) method is developed to form epitaxial layers serving as the source/drain of the MOS. Because a lattice constant of the epitaxial layer is different from that of silicon, such characteristic is employed to cause alteration to the band structure of the silicon in the channel region. Accordingly, carrier mobility of the channel region is enhanced and thus device performance is improved.

Please refer to FIG. 1, which is a schematic drawing illustrating a semiconductor structure applied with the conventional SEG method. As shown in FIG. 1, a semiconductor device 150 is positioned on a substrate 100. The semiconductor structure 150 includes a gate 110 and a gate dielectric layer 112. A spacer 114 is formed on the sidewalls of the gate 110 and the gate dielectric layer 112, lightly-doped drains (LDDs) (not shown) are formed in the substrate 100 at two sides of the gate 110, and recesses 120 are respectively formed in the substrate 100 at two sides of the spacer 114. The recess 120 includes an epitaxial layer 112 formed therein. The epitaxial layer 112 is formed by the SEG method and serves as the source/drain by performing ion implantation before or after the SEG method. As shown in FIG. 1, a channel region 130 is formed between the source/drain and underneath the gate 110. The epitaxial layers 122 formed in the source/drain region render compressive or tensile stress to the channel region 130 and thus the carrier mobility in the channel region 130 is enhanced.

However, as size of the semiconductor structure keeps shrinking, the stress provided by the epitaxial layer 122 is more and more susceptible to shapes, configuration, and material choice of the epitaxial layer 122. Furthermore, it is well-known that the epitaxial layer 122 is formed along the surface of the recess 120 during the SEG method. Therefore shapes and crystalline orientation of each surface of the recess 120 also render impacts to the epitaxial layer 122. For example, the recess 120 of the conventional semiconductor device 150 typically includes a V shape, therefore the epitaxial layer 122 formed along the surfaces of the recesses 120 obtains a V-shaped pointed end (as emphasized by circle A). Moreover, it is found that device leakage always occurs at the pointed end.

Therefore, there is still a need for a manufacturing method for a semiconductor structure that is able to form the recesses having the ideal shape, which is beneficial to form the epitaxial layer having a proper shape that improves effective stress to the channel region.

SUMMARY OF THE INVENTION

According to an aspect of the present invention, there is provided a manufacturing method for a semiconductor structure. The manufacturing method includes providing a substrate having at least a gate structure formed thereon, performing a first wet etching process to etch the substrate at two sides of the gate structure, performing a second wet etching process to etch the substrate to form a recess respectively at the two sides of the gate structure, and performing a SEG method to form an epitaxial layer having a diamond shape with a flat bottom respectively in the recesses.

According to another aspect of the present invention, there is also provided a manufacturing method for a semiconductor structure. The manufacturing method includes providing a substrate having at least a gate structure formed thereon, performing a tetra methyl ammonium hydroxide (TMAH) wet etching process to etch the substrate at two sides of the gate structure with a TMAH solution, and performing a base wet etching process to etch the substrate to form a recess respectively at two sides of the gate structure. The base wet etching process includes an etching ratio of (100) plane orientation to (111) orientation of the substrate, and the etching ratio is between 1 and 2.

According to the manufacturing method for a semiconductor structure provided by the present invention, two-stepped etching process is performed to form the recesses at two sides of the gate structure: First, a first wet etching process including TMAH solution is performed to form pre-recesses in the substrate at the two sides of the gate structure. Then, a second wet etching process including a bas solution is performed to etch the bottom and sidewalls of the pre-recesses to form the recesses. Because the base solution used in the second wet etching process has the etching ratio of (100) plane orientation to (111) orientation of the substrate, and the etching ratio is between 1 and 2, the obtained recess is formed to have a diamond shape. Furthermore, the diamond-shaped recess includes a flat bottom. It is noteworthy that the diamond-shaped recess has at least a pointed end directing toward the channel region, therefore the epitaxial layer formed along the surface of the recess obtains a pointed end toward the channel region. Accordingly, effective stress provided by the epitaxial layer to the channel region is enhanced. On the other hand, the epitaxial layer formed along the flat bottom of the recess obtains a flat bottom, consequently. Therefore, device leakage that used to occur at the pointed end is avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
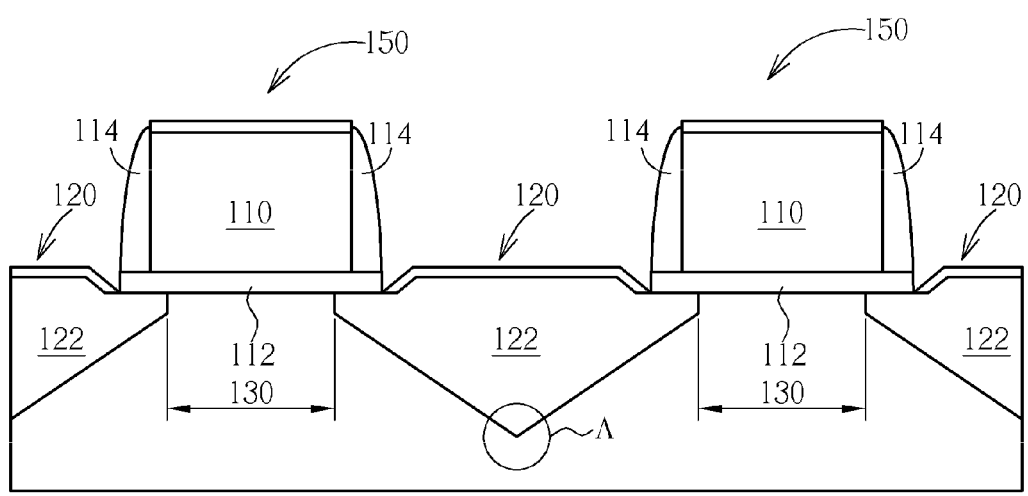
FIG. 1 is a schematic drawing illustrating a semiconductor structure applied with the conventional SEG method.
Figure 2:
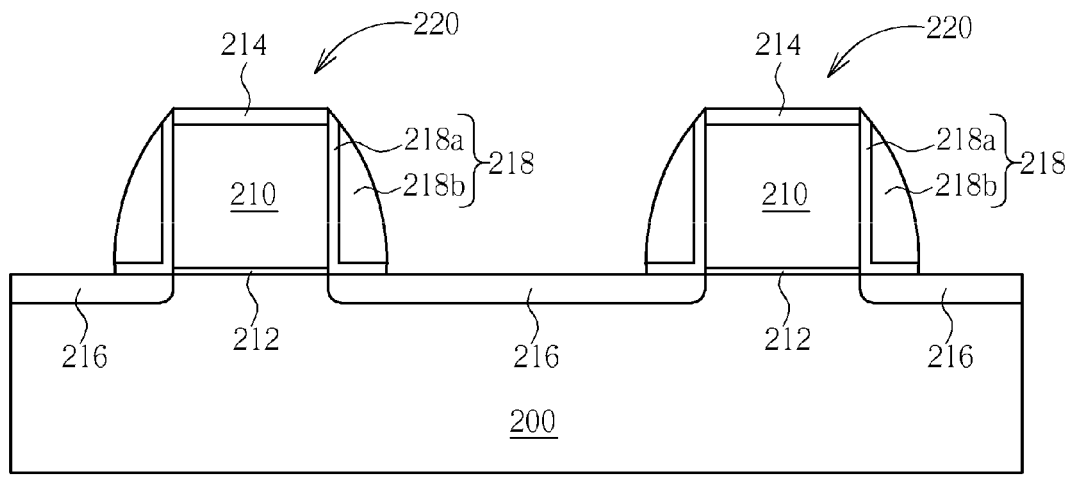
FIGS. 2-5 are drawings illustrating a manufacturing method for a semiconductor structure provided by a preferred embodiment of the present invention.

Please refer to FIGS. 2-5, which are drawings illustrating a manufacturing method for a semiconductor structure provided by a preferred embodiment of the present invention. As shown in FIG. 2, the preferred embodiment first provides a substrate 200. The substrate 200 includes a gate structure 220 formed thereon, and the gate structure 220 includes a gate dielectric layer 212, a gate 210, and a cap layer 214 sequentially and upwardly stacked on the substrate 200. It is well-known to those skilled in the art that the cap layer 214 is formed to cover the gate 210 to protect the gate 210 from damage that may be caused in any process such as photolithograph process, ion implantation, etching process, or any needed cleaning process in the semiconductor fabricating process. LDDs 216 are formed in the substrate 200 at two sides of the gate 210 and the gate dielectric layer 212 of the gate structure 220. A spacer 218 is formed on sidewalls of the gate 210 and the gate dielectric layer 212. As shown in FIG. 2, the spacer 218 preferably is a multi-layered structure including an L-shaped seal layer 218a and an insulating layer 218b covering the seal layer 218a. The spacer 218 formed on the sidewalls of the gate 210 and the gate dielectric layer 212 after forming the LDDs 216 is used to protect the sidewalls of the gate 210 and the gate dielectric layer 212 and to define positions for forming the source/drain.

Figure 3:
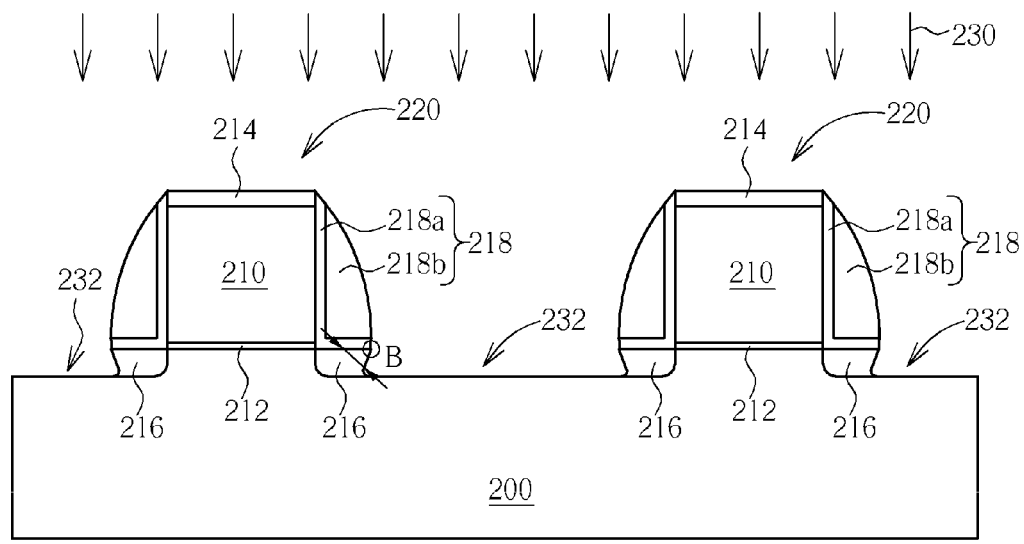

Please refer to FIG. 3. Next, a first wet etching process 230 is performed to etch the substrate 200 at two sides of the gate structure 220 with a tetra methyl ammonium hydroxide $((CH_3)_4NOH, TMAH)$ solution. In other words, the first wet etching process 230 is a TMAH wet etching process. In the preferred embodiment, a concentration of TMAH in the TMAH solution is lower than 5%, and a concentration of water ($H_2O$) is higher than 95%. The first wet etching process 230 is performed at a temperature of about 70° C., but not limited to this. More important, a performance duration of the first wet etching process 230 is between 20 seconds and 30 seconds according to the preferred embodiment. During forming the LDDs 216, the cap layer 214 and the gate 210 serve as an implantation mask, and p-type or n-type dopants, such as phosphorus (P), boron (B), or arsenic (As), required by p-type or n-type semiconductor structure are implanted into the substrate 200 to form the LDDs 216. It is noteworthy that dopants implanted into the substrate 200 change a wet etching rate of the substrate 200. Therefore the first wet etching process 230 is performed with the TMAH solution to etch LDDs 216 at the two sides of the gate structure 220 to breakthrough the LDDs 216 to its bottom, according to the preferred embodiment. As shown in FIG. 3, the first wet etching process 230 is performed to form a pre-recess 232 in the substrate 200 respectively at the two sides of the gate structure 220. Furthermore, the pre-recess 232 is formed at where the source/drain is to be formed. It is also noteworthy that a sidewall of the pre-recess 232 formed by the first wet etching process 230 has an included angle B with the surface of the substrate 200, and the included angle B is substantially 54.7 degrees)(°).

Figure 4:
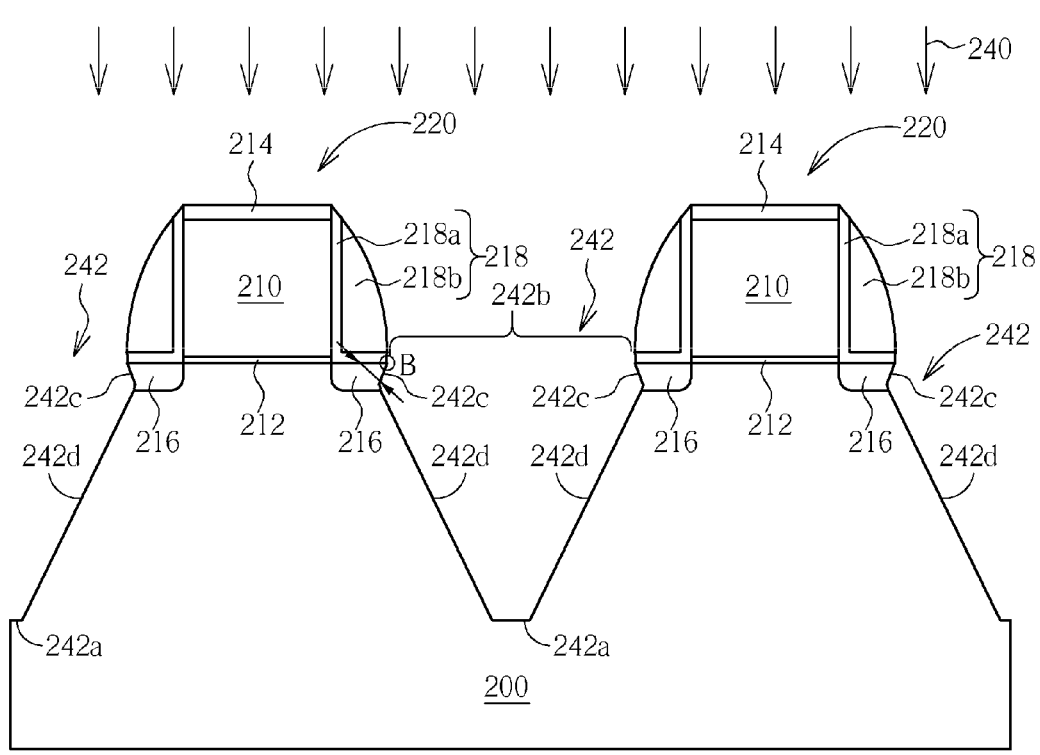

Please refer to FIG. 4. Then, a second wet etching process 240 is performed to etch the substrate 200 at the two sides of the gate structure 220 with a base solution. The second wet etching process 240 includes a base solution, the base solution includes an etching ratio of (100) plane orientation to (111) orientation of the substrate 200, and the etching ratio is between 1 and 2. For example, the base solution includes ammonia ($NH_4OH$), hydrogen peroxide ($H_2O_2$), and $H_2O$, and a proportion of $NH_4OH$, $H_2O_2$, and $H_2O$ is about 10:1:1200. Furthermore, the second wet etching process 240 is performed at room temperature. It is noteworthy that a performance duration of the second wet etching process 240 is longer than the performance duration of the first wet etching process 230. For example, the performance duration of the second wet etching process 240 is about 180 seconds. Since the second wet etching process 240 has the etching ratio of (100) plane orientation to (111) orientation of the substrate 200, which is between 1 and 2, the second wet etching process 240 vertically etches the bottom of the pre-recess 232 and laterally etches the sidewalls of the recess 232 to form a recess 242 in the substrate 200 at where used to be the pre-recess 232.

As shown in FIG. 4, the recess 242 formed by the second wet etching process 240 has a bottom surface 242a, an opening 242b, a first slanted sidewall 242c connecting to the opening 242b, and a second slanted sidewall 242d connecting to the first slanted sidewall 242c and the bottom surface 242a. Since the base solution used in the second wet etching process 240 has the etching ratio of (100) plane orientation to (111) orientation of the substrate 200, which is between 1 and 2, the recess 242 formed by the second wet etching process 240 obtains a flat bottom surface 242a, not a V-shaped bottom surface having the pointed end as the prior art. In addition, the included angle B formed by the first slanted sidewall 242c and the substrate 200 is still 54.7°. It is also noteworthy that the first slanted sidewall 242c and the second slanted sidewall 242d of the recess 242 formed by the second wet etching process 240 respectively has a (111) plane orientation while the bottom surface 242a of the recess 242 has a (100) plane orientation.

Figure 5:
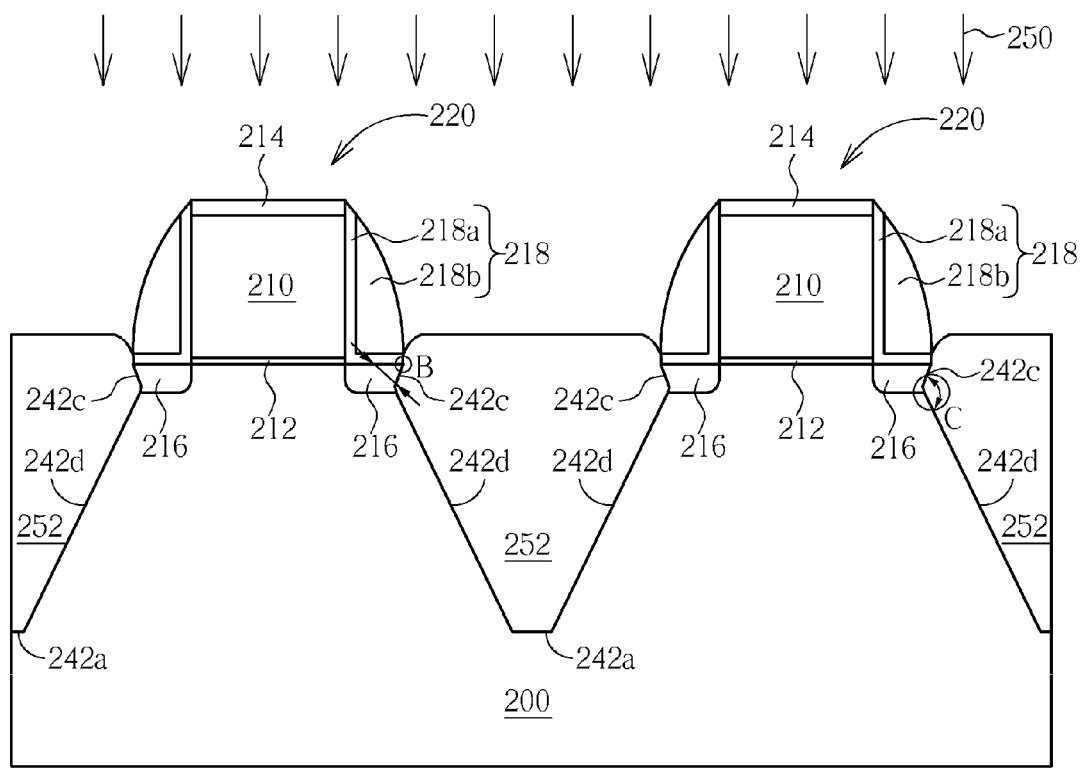

Please refer to FIG. 5. Next, a SEG method 250 is performed to form an epitaxial layer 252 in each recess 242, and the epitaxial layer 252 fills up the recess 242. It is well-known to those skilled in the art that in the SEG method 250, the epitaxial layer 252 is to grow along each surface of the recess 242. Therefore the epitaxial layer 252 is formed along the bottom surface 242a, the first slanted sidewall 242c, and the second slanted sidewall 242d of the recess 242 in the preferred embodiment. Consequently, a diamond-shaped epitaxial layer 252 is obtained as shown in FIG. 5. It is noteworthy that since the recess 242 includes the flat bottom surface 242a, the epitaxial layer 252 obtains a flat bottom accordingly. Furthermore, the epitaxial layer 252 can include a silicon germanium (SiGe) epitaxial layer or a silicon carbide (SiC) epitaxial layer required by p-type or n-type semiconductor structure. Additionally, the cap layer 214 is selectively removed and followed by performing a silicide process to form silicide (not shown) at least on the surface of the epitaxial layers 252.

In the prior art, a dry etching process has been used to form the recess, particularly, the dry etching process is used to breakthrough the LDDs. However, the dry etching process causes server lattice damage to the substrate 200. Therefore the epitaxial layer formed along the damaged lattice of the substrate 200 by the SEG method always has dislocation defects, which has adverse impact to the provided stress. Different from the prior art, the preferred embodiment provides twp-stepped etching process (the first wet etching process 230 and the second wet etching process 240) with introducing the first wet etching process 230 to breakthrough the LDDs 216. It is noticeable that the first wet etching process 230 renders no damages to the lattice of the substrate 200, therefore the dislocation defect is eliminated from the epitaxial layer 252, and thus the epitaxial layer 252 is able to provide effective stress. In the preferred embodiment, the feature that the second wet etching process 240 has the etching ratio of (100) plane orientation to (111) orientation of the substrate 200, which is between 1 and 2, is employed to form the recess 242 having the flat bottom surface 242a in the substrate 200. Accordingly, the epitaxial layer 252 formed along the flat bottom surface 242a obtains a diamond shape with a flat bottom. It is noteworthy that the epitaxial layer 252 obtains a pointed end as designated by the circle C along the first slanted sidewall 242c and the second slanted sidewall 242d of the recess 242, and the pointed end of epitaxial layer 252 provides tensile or compressive stress more effectively. Consequently, the carrier mobility in the channel region is improved. More important, the flat bottom of the epitaxial layer 252 avoids the device leakage that occurs when the epitaxial layer has the V-shaped pointed end. Accordingly, reliability of the semiconductor structure is improved.

According to the manufacturing method for a semiconductor structure provided by the present invention, two-stepped etching process is performed to form the recesses at two sides of the gate structure: First, a first wet etching process including TMAH solution is performed to form pre-recesses in the substrate at the two sides of the gate structure. Then, a second wet etching process including a bas solution is performed to etch the bottom and sidewalls of the pre-recesses to form the recesses. Because the base solution used in the second wet etching process has the etching ratio of (100) plane orientation to (111) orientation of the substrate, and the etching ratio is between 1 and 2, the obtained recess is formed to have a diamond shape. Furthermore, the diamond-shaped recess includes a flat bottom. It is noteworthy that the diamond-shaped recess has at least a pointed end directing toward the channel region, therefore the epitaxial layer formed along the surface of the recess obtains a pointed end toward the channel region. Accordingly, effective stress provided by the epitaxial layer to the channel region is enhanced. On the other hand, the epitaxial layer formed along the flat bottom of the recess obtains a flat bottom, consequently. Therefore, device leakage that used to occur at the pointed end is avoided. Briefly speaking, the manufacturing method provided by the present invention improves not only enhances the device performance but also the device reliability.

Those skilled in the art will readily observe that numerous modifications and alterations of the device and method may be made while retaining the teachings of the invention.

What is claimed is:

1. A manufacturing method for a semiconductor structure comprising:
   providing a substrate having at least a gate structure formed thereon and lightly-doped drains (LDDs) formed in the substrate at two sides of the gate structure;
   performing a first wet etching process to etch the LDDs in the substrate at two sides of the gate structure to form pre-recesses;
   performing a second wet etching process to etch the substrate to form a recess respectively at the two sides of the gate structure; and
   performing a selective epitaxial growth (SEG) method to form an epitaxial layer having a diamond shape with a flat bottom respectively in the recesses.

2. The manufacturing method for a semiconductor structure according to claim 1, wherein the first wet etching process comprises tetra methyl ammonium hydroxide ($(CH_3)_4NOH$, TMAH) solution.

3. The manufacturing method for a semiconductor structure according to claim 2, wherein a concentration of TMAH in the TMAH solution is lower than 5%.

4. The manufacturing method for a semiconductor structure according to claim 1, wherein the second wet etching process is performed to etch a bottom of the pre-recess to form the recess.

5. The manufacturing method for a semiconductor structure according to claim 1, wherein the second wet etching process comprises a base solution, the base solution comprises an etching ratio of (100) plane orientation to (111) orientation of the substrate, and the etching ratio is between 1 and 2.

6. The manufacturing method for a semiconductor structure according to claim 5, wherein the base solution comprises ammonia ($NH_4OH$), hydrogen peroxide ($H_2O_2$), and water ($H_2O$).

7. The manufacturing method for a semiconductor structure according to claim 6, a proportion of $NH_4OH$, $H_2O_2$, and $H_2O$ is about 10:1:1200.

8. The manufacturing method for a semiconductor structure according to claim 1, wherein a performance duration of the second wet etching process is longer than a performance duration of the first wet etching process.

9. The manufacturing method for a semiconductor structure according to claim 8, wherein the performance duration of the first wet etching process is between 20 seconds and 30 seconds.

10. The manufacturing method for a semiconductor structure according to claim 1, wherein the recess comprises a bottom surface, an opening, a first slanted sidewall connecting the opening, and a second slanted sidewall connecting the first slanted sidewall and the bottom surface.

11. The manufacturing method for a semiconductor structure according to claim 10, wherein the bottom surface is parallel with a surface of the substrate, the bottom surface comprises a (100) plane orientation, and the first slanted sidewall and the second slanted sidewall comprise a (111) plane orientation.

12. The manufacturing method for a semiconductor structure according to claim 1, wherein the epitaxial layer comprises a silicon germanium (SiGe) epitaxial layer or a silicon carbide (SiC) epitaxial layer.

13. A manufacturing method for a semiconductor structure comprising:
   providing a substrate having at least a gate structure formed thereon;
   performing a TMAH wet etching process to etch the substrate at two sides of the gate structure with a TMAH solution; and
   performing a base wet etching process to etch the substrate to form a recess respectively at two sides of the gate structure, the base wet etching process comprising an etching ratio of (100) plane orientation to (111) plane orientation of the substrate, and the etching ratio is between 1 and 2.

14. The manufacturing method for a semiconductor structure according to claim 13, wherein a concentration of TMAH in the TMAH solution is lower than 5%.

15. The manufacturing method for a semiconductor structure according to claim 13, wherein the base wet etching process comprises a base solution, and the base solution comprises $NH_4OH$, $H_2O_2$, $H_2O$.

16. The manufacturing method for a semiconductor structure according to claim 15, wherein a proportion of $NH_4OH$, $H_2O_2$, and $H_2O$ is about 10:1:1200.

17. The manufacturing method for a semiconductor structure according to claim 13, wherein a performance duration of the base wet etching process is longer than a performance duration of the TMAH wet etching process.

18. The manufacturing method for a semiconductor structure according to claim 13, wherein the recess comprises a bottom surface, an opening, a first slanted sidewall connecting the opening, and a second slanted sidewall connecting the first slanted sidewall and the bottom surface.

19. The manufacturing method for a semiconductor structure according to claim 18, wherein the bottom surface is parallel with the substrate, the bottom surface comprises a (100) plane orientation, and the first slanted sidewall and the second slanted sidewall comprise a (111) plane orientation.

* * * * *